April 28, 1970 L. R. TRAVIS 3,508,984

METHOD OF PRODUCING PRINTED CIRCUITS

Filed June 29, 1967

*INVENTOR.*
LAWRENCE R. TRAVIS
*BY*
McLean, Morton and Boustead
ATTORNEYS

United States Patent Office 3,508,984

Patented Apr. 28, 1970

3,508,984

METHOD OF PRODUCING PRINTED CIRCUITS

Lawrence R. Travis, Brockton, Mass., assignor to Electro Connective Systems, Inc., Brockton, Mass., a corporation of Massachusetts Filed June 29, 1967, Ser. No. 649,877
Int. Cl. B32b *31/14;* C23b *3/02*
U.S. Cl. 156—3 1 Claim

ABSTRACT OF THE DISCLOSURE

An improved method for producing printed circuitry from conductive foils bonded to insulatory backing is shown. Areas of the foil desired as the circuit pattern are masked with an etchant resistant material, unmasked foil is partially removed by etching, masking is removed and the remainder of the foil is etched away. The final circuit paths produced by the two-step etch method has rounded corners which are less damaging to coating or encapsulation materials and are not areas of high dielectric stress concentration.

This invention relates to an improved method for manufacturing printed circuitry. More specifically, it concerns a method of rounding the sharp corners on the circuit paths produced by the conventional etching techniques used in manufacturing printed circuits and cables.

Printed circuitry has been widely employed in the electrical and electronic industries. Printed circuits have been known since at least 1936 when British Patent No. 327,356 disclosed a process for bonding a conductive foil to an insulatory support, coating areas of the foil desired as the circuit path with an etchant-resistant material, etching the foil and then removing the etchant-resistant material from the circuit path remaining. More recently similar techniques have been employed in manufacturing indefinite lengths of cable consisting of parallel flat conductors on a flexible dielectric web.

There are several techniques which are used to coat foil with an etchant-resistant material, sometimes called a resist, to obtain the desired circuit pattern when the foil is subsequently subjected to etching. In one such technique disclosed in British Patent No. 461,275, the entire foil surface is coated with acid resistant material; the portions not desired for the circuit paths are then mechanically removed; the uncovered foil is etched away; and the acid resistant material masking the then developed circuit paths is finally removed. Another technique used with success to produce printed circuitry involves the printing of the desired pattern on the foil with a resist followed by the etching of the unprinted areas of foil and removal of the resist from the printed pattern. Still a further technique involves the application to the foil of a light sensitive coating or enamel. The coated surface is then exposed to light through a negative which produces the desired pattern image in the coating. The exposed light sensitive coating is developed by known photographic techniques leaving an etchant resistant coating corresponding to the desired circuit pattern. This pattern may be hardened or otherwise treated to increase its resistance to the etchant and the entire foil is then etched to remove unmasked surfaces and leave the desired circuit pattern. A more recent technique disclosed in U.S. Patent No. 3,113,896 involves the coating of the foil with a polymerizable substance, the bombardment of the so coated surface with electrons in the desired circuit pattern to polymerize the coating in the desired pattern and the etching of the foil to remove foil from areas not masked with the polymerized substance. Other more developed techniques such as those taught in U.S. Patent Nos. 2,640,764, 2,746,848 and 2,706,697 include two etching steps. In the first step, a portion of the foil in the areas not desired in the circuit pattern is removed; the exposed sides of the partially relieved circuit pattern are then treated with an etching powder which provides an etchant resistant coating on the side walls of the pattern to prevent undercutting in the subsequent etch; the foil is then etched again to remove all undesired foil and fully relieve the circuit pattern.

In all of the methods used to produce circuit patterns on insulatory backing, the circuits, i.e., the relieved portions of the conductive foil, have sharp corners connecting their top and sides. These sharp corners are formed no matter what type of resist is used. If the circuit is to be encapsulated, for example, by lamination of a top film or coating of insulation on the conductor, these sharp corners are undesirable as they may cut the lamination or coating. Where the circuit is coated with insulating material, the coating will thin out at the sharp corners and will have poor notch strength. Furthermore, these corners act as dielectric stress concentration points or lines and may reduce the electrical or magnetic efficiency of the circuit.

One method of removing the sharp corners formed is to subject the entire circuit, after etching has been completed and resist material has been removed, to a secondary etch. This technique has a substantial disadvantage in that excessive etching of the side walls of the conductors occurs and those conductors are undercut at the bottom and at the wall; furthermore, this results in poor dimensional control of the width of the conductors and of the spaces between the conductors thus resulting in less effective control of electrical and/or magnetic properties.

It is the primary object of this invention to provide a method for the manufacture of printed circuitry, which provides as an end product, a circuit path of conductive material having rounded corners which do not cause problems in encapsulating the circuit or areas of high dielectric stress concentration.

It is a further object of this invention to provide a method for manufacturing printed circuitry having circuit paths with rounded corners which is simple and economical and does not have the disadvantages of the processes wherein the fully etched printed circuit is subjected to a secondary etch in order to remove the sharp corners.

It is a further object of this invention to provide a method for producing printed circuitry having circuit paths with rounded corners which is adaptable to any technique currently employed for the production of printed circuitry.

These and other objects are achieved by an improved method for the production of printed circuitry by the selective etching of conductive foil bonded to the surface of an insulatory support comprising: coating those areas of the foil desired as circuit paths with an etch resistant material; etching the foil to remove a portion thereof from those areas uncoated with the etch resistant material, thereby forming partially relieved circuit paths; removing the etch resistant material from the said partially relieved circuit paths; and etching the foil a second time to remove therefrom the remainder of the conductive foil from areas around the circuit paths and round the uppermost corners of the then fully relieved circuit paths.

This technique can be used with any etching technique wherein a masking or etchant resistant material is used to delineate the desired circuit paths and unmasked areas are etched from the conductive foil; and it can be used with a variety of conductive foils. Any of the masking or etchant resistant materials used in this art are suitable in the present invention. The materials, which, of course, will be applied by suitable application techniques, may include various inks, enamels, glues, and bitumens. These may be applied by such techniques as contact or offset printing, dry or wet screening, lithography or photographic processes.

The insulatory support to which the conductive foil is bonded may be any suitable insulating material such as thermoplastic and thermosetting resins, including urea-formaldehyde and melamine-formaldehyde condensation products, polyimides, fluorocarbons, cellulose acetates, nylons, and other glass or ceramic material known to this art.

The conductive foils which are used can also be any of those known to the art including aluminum, zinc, magnesium and copper.

Figure 1:
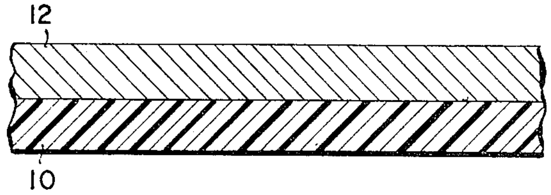
FIG. 1 is a sectional view of an insulatory backing to which is bonded a conductive foil.

In FIG. 1, reference numeral 10 refers to an insulatory backing such as a polyamide-polyimide. Bonded to backing 10 is a continuous foil of a conductive material such as copper designated by reference numeral 12. The conductive foil may be bonded to the insulatory backing by techniques well known to the art. In the illustrated case backing 10 is applied by spray coating and drying of precursor material which forms a hard, dimensionally stable film or polyamide-polyimide firmly adherent to foil 12. Depending upon the end use for which the printed circuit is designed, the thickness of the backing and the foil can be varied.

Figure 2:
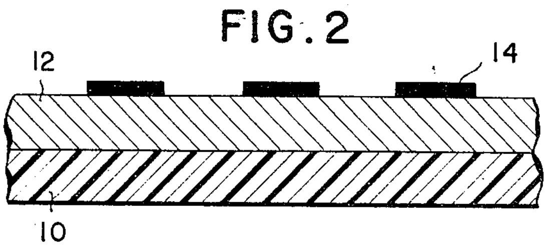
FIG. 2 is a sectional view of the foil and backing of FIG. 1 showing, in addition, the etchant resistant material coating portions of the conductive foil.

In FIG. 2, the backing and foil have been coated with an etchant resistant material shown by reference numeral 14. This can be accomplished by any of the printing, mechanical, irradiation or photographic techniques referred to briefly above. The function of the etchant resistant material 14 is to mask portions of the underlying conductive foil from the subsequent etch.

Figure 3:
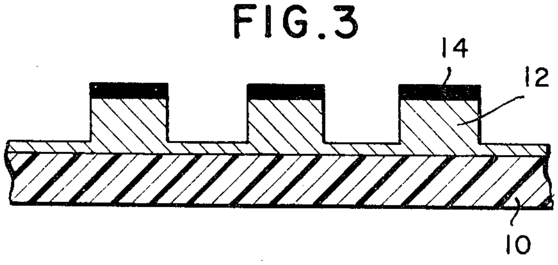
FIG. 3 is a sectional view of the foil, backing and etchant resistant material after the first etch has been completed.

In FIG. 3, the elements described above are shown after the first etch has taken place. The particular technique used to remove a portion of the conductive foil 12 depends, of course, on the nature of the foil and many techniques are known to the art. For example, an acid solution may be splashed or otherwise projected against the object to permit it to attack the bare portions of the metal. The initial etch is permitted to continue until a portion of the conductive foil has been removed from the backing. Etching may be halted by washing the etch solution from the foil and drying it. The etchant resistant material is then removed from the partially relieved circuit pattern. This may be accomplished by dissolving the ink, photo-resist or other masking material in a suitable solvent.

Figure 4:
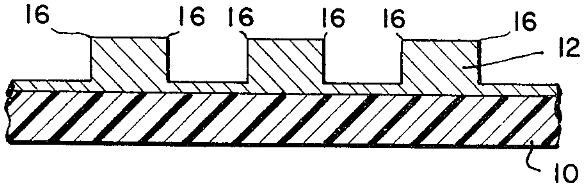
FIG. 4 is a sectional view of the foil and backing from which the etchant resistant material has been removed after the first etch.
Figure 5:
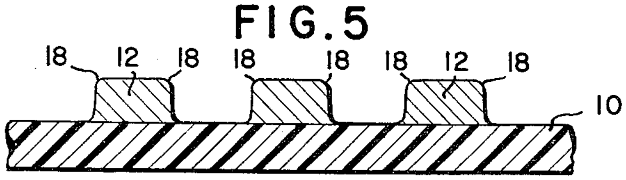
FIG. 5 is a sectional view of the circuit pattern having rounded corners and the insulatory backing after the second etch has been completed.

The partially formed circuit produced by the first etch after removal of etch resistant material 14 is shown in FIG. 4. The sharp corners, which are undesirable for the reasons set forth above, are designated by numeral

16. The foil is then subjected to a second etch which may be similar to the first in which the remainder of the conductive foil between areas of the circuit pattern is removed. This step, in addition to removing unwanted conductive foil, rounds the sharp corners formed after the first etch thus making the final printed circuit more satisfactory for encapsulation and removing areas of high dielectric stress concentration. The rounded corners are shown by numeral 18.

The relative amount of conductive foil removed between the first and second etch depends upon the degree to which it is desired to round the corners of the circuit pattern. Obviously, there is some loss of height of the pattern during the second etch and this also must be considered. If desired, the known techniques of protecting the sides of the partially relieved circuit pattern can be incorporated in the present method but they may, to some degree, reduce the rounding achieved by the second etch.

The following example demonstrates the method of this invention:

EXAMPLE

A copper foil having a thickness of 0.0028 inch and bonded to an insulatory backing of polyamide-polyimide solid dielectric film is used for preparing a printed circuit. The copper foil is printed with Nelco R7366 lacquer resist using the doctor blade technique in copending Weber application S.N. 650,089, filed of even date herewith, to coat the surface of the copper with a desired conductor pattern. Copper foil is then immersed in a bath of 42° Baumé aqueous ferric chloride solution at 90° F. and allowed to remain in the bath for approximately 3 to 5 minutes. The foil is removed from the etchant bath and washed with water to halt the etching process when approximately 90% of the foil in areas unmasked by the ink has been removed leaving approximately 0.0005" of foil in the unmasked areas. The ink masking the circuit pattern is then dissolved by immersing the entire foil in a bath of toluene at room temperature. The unmasked foil is then again subjected to etching in the ferric chloride bath for 30 seconds to a minute to remove the remainder of the copper in the areas between the circuit pattern. The final circuit pattern has substantially rounded corners.

I claim:

1. An improved method for the production of printed circuitry by the selective etching of conductive foil bonded to the surface of an insulatory support comprising: coating those areas of the foil desired as circuit paths with an etchant resistant material; etching the foil to remove a portion thereof from those areas uncoated with the etchant resistant material thereby forming partially relieved circuit paths; removing the etchant resistant material from the said partially relieved circuit paths; and etching the foil a second time to remove therefrom the remainder of the conductive foil from areas around the circuit paths and round the uppermost corners of the then fully relieved circuit paths.

References Cited

UNITED STATES PATENTS

| | | | |
|---|---|---|---|
| 2,695,351 | 11/1954 | Beck | 156—3 XR |
| 2,955,027 | 10/1960 | Newell et al. | 156—6 |

JACOB H. STEINBERG, Primary Examiner

U.S. Cl. X.R.

96—36.2; 156—6